(12) United States Patent
Aoki

(10) Patent No.: US 7,939,819 B2
(45) Date of Patent: May 10, 2011

(54) CIRCUIT BOARD, ELECTRO-OPTICAL DEVICE, AND ELECTRIC APPARATUS

(75) Inventor: Takashi Aoki, Suwa (JP)

(73) Assignee: Seiko Epson Corporation (JP)

( * ) Notice: Subject to any disclaimer, the term of this patent is extended or adjusted under 35 U.S.C. 154(b) by 541 days.

(21) Appl. No.: 11/685,978

(22) Filed: Mar. 14, 2007

(65) Prior Publication Data

US 2007/0215377 A1    Sep. 20, 2007

(30) Foreign Application Priority Data

Mar. 15, 2006   (JP) ................. 2006-071727

(51) Int. Cl.
*H01L 51/05*    (2006.01)
(52) U.S. Cl. .................. 257/40; 257/E51.006
(58) Field of Classification Search ............ 257/40, 257/E51.001–E51.052; 438/99
See application file for complete search history.

(56) References Cited

U.S. PATENT DOCUMENTS

| | | | | |
|---|---|---|---|---|
| 4,946,549 | A * | 8/1990 | Bachman et al. .............. | 216/69 |
| 6,661,024 | B1 * | 12/2003 | Zhang et al. .................. | 257/40 |
| 7,352,038 | B2 * | 4/2008 | Kelley et al. ................. | 257/410 |
| 7,397,086 | B2 * | 7/2008 | Wu et al. ..................... | 257/347 |
| 2006/0094153 | A1 * | 5/2006 | Furukawa ..................... | 438/99 |
| 2006/0113569 | A1 * | 6/2006 | Akinwande et al. .......... | 257/213 |
| 2006/0186398 | A1 * | 8/2006 | Hsieh et al. .................. | 257/40 |
| 2007/0221958 | A1 * | 9/2007 | Aoki ............................. | 257/211 |
| 2008/0283833 | A1 * | 11/2008 | Kim et al. ..................... | 257/59 |
| 2009/0146138 | A1 * | 6/2009 | Aoki ............................. | 257/40 |

FOREIGN PATENT DOCUMENTS

| | | |
|---|---|---|
| JP | 2005-101555 | 4/2005 |
| JP | 2006-210930 | 8/2006 |

OTHER PUBLICATIONS

Yasuda, T., et al. "Organic Field-Effect Transistors with Gate Dielectric Films of Poly-p-Xylylene Derivatives Prepared by Chemical Vapor Deposition." Jpn. J. Appl. Phys., vol. 42 (2003): pp. 6614-6618.*
Yasuda, T. and Tsutsui, T. "Organic Field-Effect Transistors Based on High Electron and Ambipolar Carrier Transport Properties of Copper-Phthalocyanine." Chem. Phys. Lett., vol. 402 (2005): pp. 395-398.*

(Continued)

*Primary Examiner* — Matthew W Such
(74) *Attorney, Agent, or Firm* — Harness, Dickey & Pierce, P.L.C.

(57) ABSTRACT

A circuit board includes a source electrode, a drain electrode, and a gate electrode provided on a surface of a substrate, a first insulating layer insulating the source electrode and the drain electrode from the gate electrode, an organic semiconductor layer provided so as to contact the first insulating layer, and a second insulating layer provided so as to contact the organic semiconductor layer, wherein the second insulating layer includes a compound represented by Formula 1,

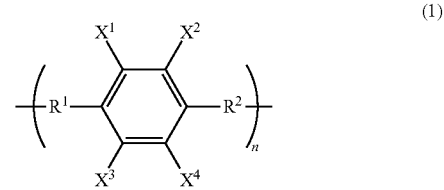

(1)

where $R^1$ and $R^2$ each independently represent substituted or unsubstituted alkylene group which can have; $X^1, X^2, X^3$, and $X^4$ each represent hydrogen or an electrophilic group, but not all hydrogen and n represents a number in the range of 100 to 100,000.

19 Claims, 7 Drawing Sheets

OTHER PUBLICATIONS

Newman, C.R., et al. "High Mobility Top-Gated Pentacene Thin-Film Transistors." J. Appl. Phys., vol. 98 (2005): Article 084506.*

Feili, D., et al. "Encapsulation or Organic Field Effect Transistors for Flexible Biomedical Microimplants." Sens. Actu. A, vol. 120 (2005): pp. 101-109.*

Lo, J.-W. & Tai, Y.C. "Performance of Parylene-Packaged Flexible Pentacene Thin-Film Transistors in Saline." IEEE Proc. Int. Conf. Microtech. Med. & Bio. (May 9-12, 2006): pp. 93-96.*

Tsukagoshi, K., et al. "Pentacene Transistor Encapsulated by Poly-para-xylylene Behaving as Gate Dielectric Insulator and Passivation Film." Appl. Phys. Lett., vol. 87 (2005): Article: 183502.*

Kymissis, I., et al. "A Lithographic Process for Integrated Organic Field-Effect Transistors." J. Disp. Technol., vol. 1 (Dec. 2005): pp. 289-294.*

Kymissis, I., et al. "Patterning Pentacene Organic Thin Film Transistors." J. Vac. Sci. Technol. B, vol. 20 (May/Jun. 2002): pp. 956-959.*

* cited by examiner

CIRCUIT BOARD, ELECTRO-OPTICAL DEVICE, AND ELECTRIC APPARATUS

BACKGROUND

1. Technical Field

The present invention relates to a circuit board, an electro-optical device, and an electric apparatus.

2. Related Art

Recently, as a device substituting for a thin-film field effect transistor using inorganic materials such as silicon, an organic thin-film field effect transistor has attracted attention. This is because a method of manufacturing constituent elements of such an organic thin-film field effect transistor is simple, properties of the constituent material can be changed by changing the molecular structure of the organic semiconductor material and the organic thin film field effect transistor is more flexible, lighter, and stronger than the thin-film field effect transistor formed using an inorganic semiconductor.

Since there is interaction between a substrate and a semiconductor layer forming a transistor, it is important which material is selected for forming the substrate. For example, JP-A-2005-101555 discloses a study of an organic field effect transistor having an organic insulating layer containing an aromatic compound.

However, the optimum amount of an active group to be contained in an insulating layer of a transistor and a relationship of electrical resistance between the insulating layer and a semiconductor layer required consideration. Additionally, mobility of charge carriers of the semiconductor may not be sufficiently improved.

SUMMARY

An advantage of the present invention is that it provides an organic field effect transistor having an insulating layer with improved carrier mobility without requiring consideration of a relationship of electrical resistance between the insulating layer and a semiconductor layer thereof.

The advantage is implemented by an aspect of the invention.

According to an aspect of the invention there is a circuit board including a source electrode, a drain electrode, and a gate electrode provided on a surface of a substrate, a first insulating layer insulating the source electrode and drain electrode from the gate electrode, an organic semiconductor layer provided so as to contact the first insulating layer, and a second insulating layer provided so as to contact the organic semiconductor layer, wherein the second insulating layer includes a compound represented by Formula 1,

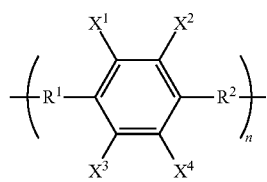

(1)

where $R_1$ and $R_2$ each independently represent a substituted or unsubstituted alkylene group; $X_1$, $X_2$, $X_3$, and $X_4$ each represent hydrogen or an electrophilic group but are not all hydrogen; and n represents a number in the range of 100 to 100,000.

The alkylene group may have the carbon numbers 1 to 10. Accordingly, the compound represented by Formula 1 may be easily synthesized, thereby simply obtaining a circuit board economically.

Any two of $X_1$, $X_2$, $X_3$, and $X_4$ may be the electrophilic group. Accordingly, the compound represented by Formula 1 may be easily synthesized, thereby simply obtaining a circuit board economically.

The electrophilic group may be at least one group selected from the group consisting of a halogen atom, a carboxyl group, a cyano group, a nitro group, a phenyl group, a hydroxyl group, a sulfone, and a thiol group.

Accordingly, as well as improving a mobility, circuit board may have a more high-quality performance such as improving ON-OFF ratio, lowering a threshold value of a voltage, improving lifetime, and the like.

The halogen atom may be a fluorene atom, a chlorine atom, a bromine atom, or an iodine atom.

Accordingly, as well as improving mobility, a circuit board may have a more high-quality performance such as improving ON-OFF ratio, lowering a threshold value of a voltage, improving lifetime, and the like.

A weight-average molecular weight of the compound represented by Formula 1 may be 10,000 to 1,000,000, thereby simply obtaining the compound represented by Formula 1.

The compound represented by Formula 1 may be poly-(dichloro-p-xylylene). Accordingly, as well as improving the mobility, the circuit board may have a more high-quality performance such as improving ON-OFF ratio, lowering a threshold value of a voltage, improving lifetime, and the like.

The second insulating layer may be provided so as to contact the substrate. Accordingly, an insulating effect of the substrate may improve, thereby obtaining a high-quality circuit board.

The organic semiconductor layer may have a p-type semiconducting property. Accordingly, a hole properly moves, thereby obtaining a high-quality semiconducting property.

The second insulating layer may be formed on the substrate, the source electrode and the drain electrode are formed on the second insulating layer, the organic semiconductor layer is formed on the source electrode and the drain electrode, the first insulating layer is formed on the organic semiconductor layer, and the gate electrode is formed on the first insulating layer. Accordingly, the circuit board may be used as various uses such as a liquid crystal display element.

The second insulating layer may be formed on the substrate, the organic semiconductor layer is formed on the second insulating layer, the source electrode and the drain electrode are formed on the organic semiconductor layer, the first insulating layer is formed on the source electrode and the drain electrode, and the gate electrode is formed on the first insulating layer. Accordingly, the circuit board may be used as various uses such as a liquid crystal display element.

According to another aspect of the invention, there is an electro-optical device including the circuit board. Accordingly, the electro-optical device may have a high reliability.

According to another aspect of the invention, there is an electronic apparatus including the electro-optical device. Accordingly, the electro-optical device may have a high reliability.

Additionally, a mechanism of obtaining an operational effect according to an aspect of the invention is not clearly known. However, it is considered that an electron is pulled from a semiconductor layer so as to improve a carrier density of the semiconductor layer and decrease a carrier-trap level of the semiconductor layer, by containing a compound that has a substituent with the electrophilic property in an insulating layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a circuit board, a method of manufacturing the circuit board, and an electronic apparatus will be now described in detail with reference to the attached drawings.

First Embodiment

First, a first embodiment of a circuit board according to the invention will be now described.

(1) Circuit Board

Figure 1:
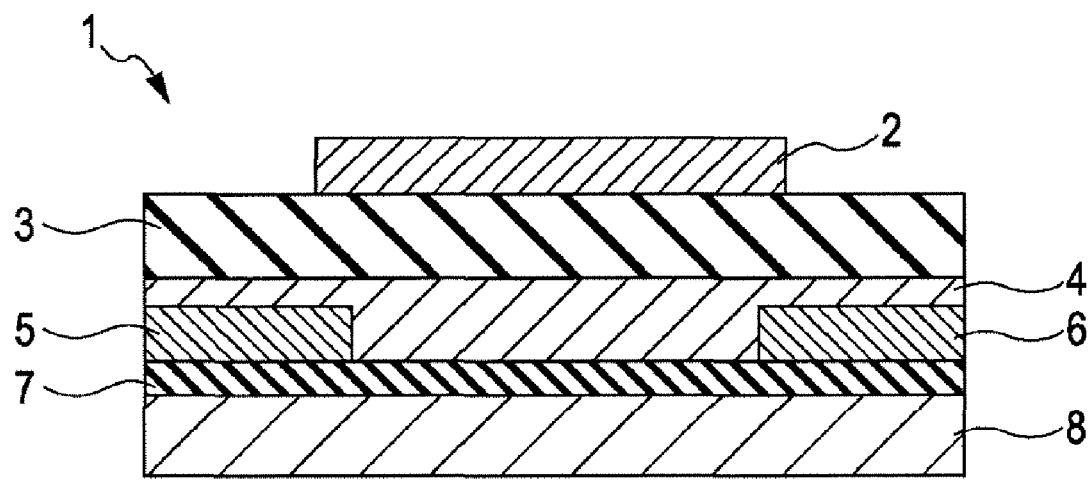
FIG. 1 is a schematic diagram of a circuit board according to the embodiment.

FIG. 1 is a longitudinal cross-sectional view of a circuit board according to an aspect of the invention. The terms "upper" and "lower" are used with reference to the drawing in FIG. 1.

A circuit board 1 in FIG. 1 is constituted from a gate electrode 2, a first insulating layer 3, an organic semiconductor layer 4, a source electrode 5, a drain electrode 6, a second insulating layer 7, and a substrate 8, and includes a transistor having a top-gate bottom-contact structure. Practically, the transistor is formed on the substrate 8 of the circuit board 1. The structure of each member will be sequentially described below.

The gate electrode 2 applies an electrical field to the organic semiconductor layer 4 and is provided on one surface of the substrate 8. The gate electrode 2 contacts the first insulating layer 3 and does not contact the source electrode 5 and the drain electrode 6.

A material of the gate electrode 2 is not particularly limited so long as the material has a conductive property. Examples of the material include a metal such as chromium, aluminum, tantalum, molybdenum, niobium, copper, silver, gold, platinum, palladium, indium, nickel, neodymium, or an alloy thereof, or a conductive metal oxide such as zinc oxide, tin oxide, indium oxide, gallium oxide, or a conductive metal compound oxide such as indium-tin oxide (abbreviated as "ITO", below), indium-zinc oxide (abbreviated as "IZO", below), aluminum-zinc oxide (AZO), gallium-zinc oxide (GZO), or a conductive polymer such as polyaniline, polypyrrole, polythiophene, and polyacetylene, or any one of these polymers doped with an acid (hydrochloric acid, sulfuric acid, sulfonic acid, and the like), a Lewis acid (phosphorus hexafluoride, arsenic pentafluoride, iron chloride, and the like), a halogen atom (iodine), or a metal atom (sodium, potassium, and the like), or a conductive composite material dispersed with carbon black or metal particles. Alternatively, a polymer mixture containing conductive particles such as metal fine particles and graphite may be also used. These materials may be used alone or in combination. Among these materials, metal alloys are preferred, and an alloy of gold and chromium is more preferred. Accordingly, the circuit board 1 realizes a high-quality transistor with improved flow of electricity.

An average thickness of the gate electrode 2 is not particularly limited, but is preferably in the range of 0.1 to 2000 nm or so, and more preferably in the range of 1 to 1000 nm or so.

The first insulating layer 3 insulates the source electrode 5 and the drain electrode 6 from the gate electrode 2. The first insulating layer 3 is provided on one surface of the substrate 8 and is provided so as to contact the gate electrode 2 and the organic semiconductor layer 4.

A material of the first insulating layer 3 may be a known organic material or inorganic material that has insulating property.

Examples of the organic material include polymethyl methacrylate, polyvinylphenol, polyimide, polystyrene, polyvinyl alcohol, polyvinylacetate, and polymers such as those represented by Formula 1 below. These may be used alone or in combination.

Examples of the inorganic material include material oxides such as silicon oxide, aluminum oxide, tantalum oxide, zirconium oxide, ceric oxide, zinc oxide, and cobalt oxide; metal nitrides such as silicon nitride, aluminum nitride, zirconium nitride, ceric nitride, zinc nitride, cobalt nitride, titanium nitride, and tantalum nitride; and metal compound oxides such as barium strontium titanate and lead zirconium titanate. These may be used alone or in combination.

An organic substance is preferred, and, more specifically, the compound represented by Formula 1 or polymethyl methacrylate is preferable, thereby improving an insulation property.

It is sufficient that the first insulating layer 3 contains the organic material represented by Formula 1. However, more specifically, it is preferable that the first insulating layer 3 contains the compound in the amount of 50 to 100 wt %, and more preferably in the amount of 70 to 100 wt %. Since electrons are properly withdrawn from the organic semiconductor layer 4 to improve carrier density and lower the carrier trap level, the charge carrier mobility can be improved or the threshold voltage can be reduced. The compound represented by Formula 1 will be described in detail below.

The average thickness of the first insulating layer 3 is not particularly limited, but it is preferably in the range of 100 to 10000 nm, and more preferably in the range of 500 to 1500 nm. In this manner, the operating voltage of the transistor in the circuit board 1 can be decreased.

In the organic semiconductor layer 4, the electric field applied by the gate electrode 2 makes electricity flow from the source electrode 5 to the drain electrode 6. The organic semiconductor layer 4 is provided on one surface of the substrate 8 and formed so as to contact the first insulating layer 3, the source electrode 5, the drain electrode 6, and the second insulating layer 7.

A material of the organic semiconductor layer 4 is not particularly limited so long as the material has a semiconducting property. Examples of the material include an α-oligothiophene such as poly(3-alkylthiophene), poly(3-hexylthiophen) (P3HT), poly(3-oxtylthiophene), poly(2,5-thienylenevinylene) (PTV), quarterthiophene (4T), sexithiophene (6T), or octylthiophene; a thiophene derivative such as 2,5-bis(5'-biphenyl-2'-thienyl)-thiophene (BPT3), or 2,5-[2,2'-(5,5'-diphenyl)dithienyl]-thiophene; a phenylenevinylene derivative such as poly(para-phenylenevinylene) (PPV); a fluorene derivative such as poly(9,9-dioctylfluorene) (PFO); an acene compound such as triallylamine-based polymer, anthracene, tetracene, pentacene, or hexacene; a benzene derivative such as 1,3,5-tris[(3-phenyl-6-tri-fluoromethyl)quinoxalin-2-yl]benzene (TPQ1), 1,3,5-tris[{3-(4-t-butylphenyl)-6-trisfluoromethyl}quinoxalin-2-yl]benzene (TPQ2); a phthalocyanine derivative such as phthalocyanine, copper phthalocyanine (CuPc), iron phthalocyanine, or all fluorinated phthalocyanine; an organic metal compound such as tris(8-hydroxyquinolinolate)aluminum (Alq3) or factris(2-phenylpyridine)iridium (Ir(ppy)3); a polymeric compound such as C60, an oxadiazole-based polymer, triazole-based polymer, a carbazole-based polymer, or a fluorene-based polymer; and a copolymer including fluorene such as poly(9,9-dioctylfluorene-co-bis-N,N'-(4-methoxyphenyl)-bis-N,N'-phenyl-1,4-phenylenediamine) (PFMO), poly(9,9-dioctylfluorene-co-benzothiadiazole) (BT), fluorene-triallylamine copolymer, or poly(9,9-dioethylfluorene-co-dithiophene) (F8T2). These may be used alone or in combination. The copolymer including fluorene is preferable and, more specifically, F8T2 is preferable, thereby having a good semiconducting property.

It is preferable that the semiconductor material has a p-type semiconducting property. In this manner, holes migrate adequately, and a circuit board 1 having a high-performance transistor can be obtained.

The organic semiconductor layer 4 preferably has an average thickness in the range of 0.5 to 1000 nm, more preferably in the range of 1 to 500 nm, and thereby allowing electricity to flow properly and realizing improved charge carrier mobility.

The source electrode 5 is provided on the substrate 8 and is formed so as to contact the organic semiconductor layer 4 and the second insulating layer 7.

A material of the source electrode is the same as that of the gate electrode 2.

An average thickness of the source electrode 5 is not especially limited, but it is preferably in the range of 10 to 2000 nm, and more preferably in the range of 100 to 1000 nm, such that the source electrode 5 has a good conductive property.

A material and average thickness of the drain electrode 6 are the same as those of the source electrode 6.

The source electrode 5 and the drain electrode 6 may be formed of the same compound or the different compounds, but are preferably formed of the same compound.

A distance (channel distance) of the source electrode 5 and the drain electrode 6 is preferably 1 to 500 μm, and more preferably in the range of 5-20 μm such that the transistor of the circuit board 1 has improved characteristics.

The distance (channel length) between the source electrode 5 and the drain electrode 6 is preferably in the range of 0.05 to 10 mm, and more preferably in the range of 0.01 to 1 mm such that an appropriate ON current may be made available and a parasitic capacitance may be lowered. Accordingly, the circuit board 1 forms a transistor of good quality.

The second insulating layer 7 is for insulating the gate electrode 2, the organic semiconductor layer 4, the source electrode 5, the drain electrode 6, or the substrate 8. The second insulating layer 7 is provided on one surface of the substrate 8 and formed so as to contact the organic semiconductor layer 4, the source electrode 5, the drain electrode 5, and the substrate 8.

A material of the second insulating layer 7 is the same as that of the first insulating layer 3, but it is preferable that a main component is the compound represented by Formula 1, more preferably in the range of 50 to 100 wt %, and the most preferably in the range of 70 to 100 wt %. Since the second insulating layer 7 pulls electrons into the organic semiconductor layer 4 so as to improve carrier density and decrease carrier trap level, the mobility may be improved or the threshold voltage may be reduced.

When the main component is the compound represented by Formula 1, the second insulating layer 7 may contain other compounds and contain two or more kinds of the compound represented by Formula 1 so long as the characteristics of the transistor of the circuit board 1 are not affected.

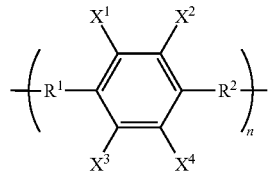

(1)

where $R^1$ and $R^2$ each independently represent an substituted or unsubstituted alkylene group; $X^1$, $X^2$, $X^3$ and $X^4$ each represent hydrogen or an electrophilic group but are not all hydrogen; and n represents a number in the range of 100 to 100,000.

where $R^1$ and $R^2$ each independently represent an substituted or unsubstituted alkylene group; $X^1$, $X^2$, $X^3$ and $X^4$ each represent hydrogen or an electrophilic group but are not all hydrogen; and n represents a number in the range of 100 to 100,000.

$R^1$ and $R^2$ each independently represent a substituted or unsubstituted alkylene group in the formula (1). The alkylene group has preferably 1 to 20 carbon atoms, more preferably 1 to 10 carbon atoms, and most preferably 1 to 4 carbon atoms. Particularly, the alkylene group, a methylene group, an ethylene group, a propylene group, a pentylene group, a heptylene group, and a nonylene group are givens as exemplary examples. Particularly, the methylene group is preferable. By using the alkylene group, the compound represented by Formula 1 can be easily synthesized.

As a substituent that can substitute a hydrogen atom in the alkylene group, an alkyl group of the carbon numbers 1 to 10, halogen atoms such as a fluorene atom, a chlorine atom, a bromine atom, an iodine atom, and an electrophilic group such as a carboxyl group, a cyano group, a nitro group, a phenyl group, a hydroxyl group, a sulfone group, and a thiol group are given as exemplary examples. The halogen atoms that have an electrical absorption property are preferable since electrons can be withdrawn from the organic semiconductor layer 4. Accordingly, the carrier density of the organic semiconductor layer 4 may be improved and the carrier trap level may be lowered.

$X^1$, $X^2$, $X^3$ and $X^4$ each represent hydrogen or an electrophilic group but are not all hydrogen. As the electrophilic group, halogen atoms such as a fluorene atom, a chlorine atom, a bromine atom, and an iodine atom, a carboxyl group, a cyano group, a nitro group, a phenyl group, a hydroxyl group, a sulfone group, a thiol group are given as exemplary examples. These may be used alone or in combination. The halogen atoms are preferable so as to enable the pulling of more electrons from the organic semiconductor layer 4, and the chlorine atom is still more preferable. Since the carrier density may be improved and the carrier trap level may be lowered, the mobility may be improved or the threshold voltage may be reduced.

Hydrogen or the electrophilic group can be substituted for any one of $X^1$, $X^2$, $X^3$ and $X^4$. For example, when $R^1$ and $R^2$ are the same group and the electrophilic group is monosubstituted or trisubstituted, any one of $X^1$ to $X^4$ can be substituted. When the electrophilic group is disubstituted, $X^1$ and $X^2$, $X^1$ and $X^3$, or $X^1$ and $X^4$ are substituted by the electrophilic group. On the other hand, when $R^1$ and $R^2$ are different, and the electrophilic group is monosubstituted, any group can be substituted, but when $R^1$ and $R^2$ are different, and the electrophilic group is disubstituted, $X^2$ and $X^4$ can be substituted by the electrophilic group plus the combination of the above disubstituted case. When the electrical absorption group is trisubstituted, $X^1$, $X^2$, and $X^3$ or $X^1$, $X^2$, and $X^4$ are substituted.

In this case, when electrons are pulled from the organic semiconductor layer 4, it is preferable that at least any two are substituted by the electro-absorbing group and it is more preferable that $X^1$, $X^2$, $X^3$, and $X^4$ are all substituted. Accordingly, a carrier density is improved and a carrier trap level is decreased so as to improve the mobility, improve ON-OFF ratio, decrease a threshold voltage, realize stable operation in an oxygen and moisture ambient, and improve element life.

A weight-average molecular weight of the compound represented by Formula 1 is preferably in the range of 10,000 to 1,000,000. Accordingly, n is preferably a number in the range of 100 to 10,000. The compound represented by Formula 1 is simply synthesized in this range such that electrons are properly pulled from the organic semiconductor layer 4 due to an increase in the number of electrophilic groups.

In combinations of $R^1$, $R^2$, and $X^1$ to $X^4$ described above, the compounds represented by Formula 1 are shown in detail hereafter.

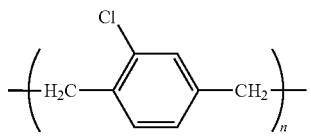

1

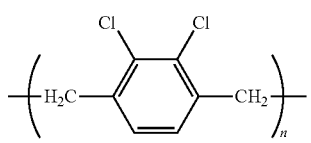

2

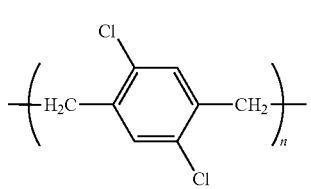

3

-continued

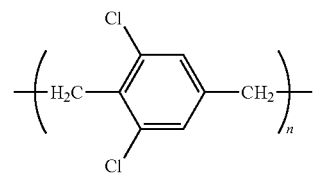

4

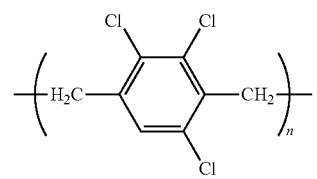

5

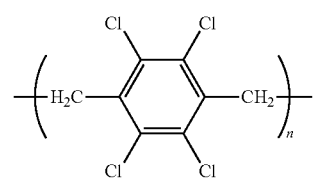

6

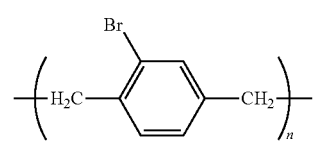

7

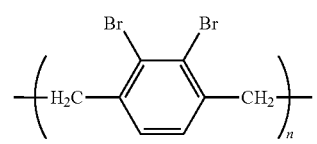

8

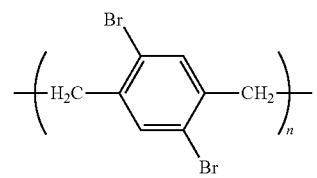

9

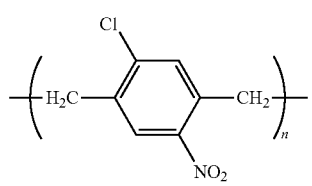

10

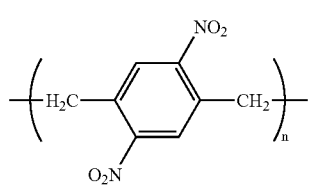

11

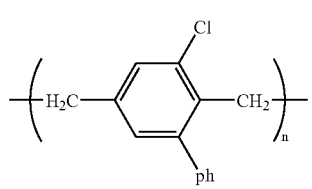

12

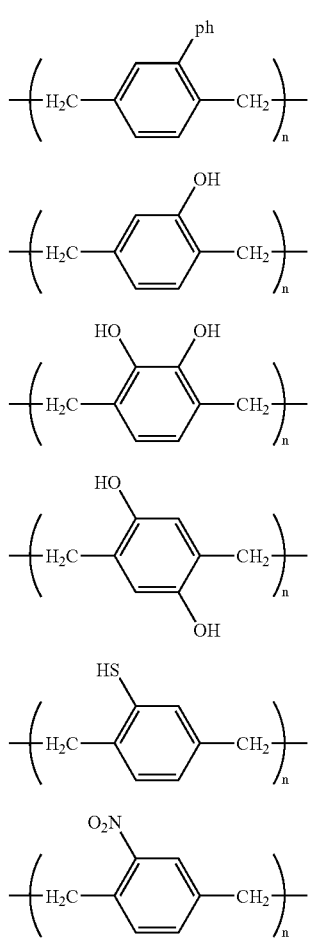

In terms of pulling electrons from the organic semiconductor layer 4, the compounds 2, 4, and 6 are particularly preferable in the above-compounds. By using a substance that has a good capability in pulling electrons, a trap level is decreased and a hole concentration is increased in the organic semiconductor layer 4 so as to improve the mobility, improve ON-OFF ratio, decrease a threshold voltage, and the like.

An average thickness of the second insulating layer 7 is preferably in the range of 10 to 10,000 nm, and more preferably in the range of 200 to 1000 nm, thereby creating the circuit board 1 including the transistor with a low cost and a high performance.

The substrate 8 supports each layer (each section) constituting the circuit board. For example, a glass substrate, a quartz substrate, a silicon substrate, a metal substrate formed of molybdenume, copper, aluminum, stainless steel, magnesium, iron, nickel, gold, silver, and the like, a semiconductor substrate formed of gallium-arsenic, and the like, a plastic substrate, and the like may be used.

Among these substrates, the plastic substrate is preferable. By using these substrates, it is possible to create a lightweight, flexible and low cost circuit board. A film of the compound represented by Formula 1 may be formed at normal temperatures. The compound having a good process resistant characteristics and represented by Formula 1 is formed on the back surface as well as the surface where the transistor is formed, thereby providing process resistance and chemical resistance on the back surface.

The plastic substrate may be formed of a thermoplastic resin or a thermohardening resin. For example, polyolefin such as a polyethylene resin, polypropylene, ethylene-propylene a copolymer, an ethylene-vinyl acetate copolymer (EVA), polyester such as cyclic polyolefin, modified polyolefin, polyvinyl chloride, polyvinylidene chloride, polystyrene, polyamide, polyimide (PI), polyamide-imide, polycarbonate, poly-(4-methylpentene-1), ionomer, an acrylic-based resin, polymethylmethacrylate, an acryl-styrene copolymer (AS resin), a butadiene-styrene copolymer, a polio copolymer (EVOH), polyethylene-terephthalate (PET), polyethylene terephthalate, polyethylene naphthalate (PEN), free hexahexane terephthalate (PCT), any kind of thermoplastic elastomer such as polyether, polyether ketone, polyether sulfone (PES), polyetherimide, polyacetal, polyperylene oxide, modified polyperylene oxide, polyarylate, aromatic polyester (liquid crystal polymer), polytetrafluoroethylene, polyvinylidene-fluoride, other fluorene-based resins, a styrene system, a polyolefin system, polyvinylchloride, a polyurethane system, a fluoro-rubber system, chlorinate polyethylene, and the like, an epoxide resin, a phenol resin, an urea resin, a melamine resin, unsaturated polyester, a silicon resin, polyurethane, and the like, or a copolymer, a blended substance, a polymer alloy, and the like mainly including these substances are given as exemplary examples, and laminations formed of at least one kind of substances may be used.

The circuit board 1 is obtained as described above.

The circuit board 1 is preferably used as an active matrix device. An active matrix liquid device, as described in detail below, refers to an electro-optical device. That is, the electro-optical device such as liquid crystal elements, polymer-dispersed liquid crystal elements, electrophoresis display elements, an electroluminescent device, or an electrochromic device formed on an upper surface of a substrate and controlled. The transistor included in the circuit board 1 serves as a switching element included in the active matrix device. The circuit board 1 according to an aspect of the invention may have a function of digital devices or analog devices such as a logical circuit with AND, OR, NAND, NOT, a memory element, an oscillation element, amplifying element, and the like. Additionally, by combining the above elements, an IC card or an IC tag may be created.

(2) Method of Manufacturing Semiconductor Device.

Next, a method of manufacturing the circuit board 1 according to an aspect of the invention will be described. The above-described circuit board 1 may be manufactured as follows.

The method of manufacturing the circuit board 1 shown in FIG. 1 is as follows: a step [A1] of forming the second insulating layer 7 on the substrate 8, a step [A2] of forming the source electrode 5 and the drain electrode 6 on the second insulating layer 7, a step [A3] of forming the organic semiconductor layer 4 on the source electrode 5, the drain electrode 6, and the second insulating 7, a step [A4] of forming the first insulating 3 on the organic semiconductor layer 4, and a step [A5] of forming the gate electrode 2 on the first insulating layer 3.

[A1] Process of Forming Second Insulating Layer

First, before the second insulating layer 7 is formed on the substrate 8, a pretreatment for improving adhesion of the compound represented by Formula 1 with the substrate 8 is preferably performed. As the pretreatment, a surface treatment of using a surface reforming substance such as hexamethyldisilazane, cyclohexene, octadecyltrichlorosilane, an organic washing treatment of using acetone, isopropyl alcohol and the like, an acid treatment of using hydrochloric acid, sulfuric acid, acetic acid, an alkali treatment of using sodium hydroxide, potassium hydroxide, ammonia, and the like, a UV ozone treatment, a fluorination treatment, a plasma treatment of using oxygen or argon, and a Langmuir-Blodgett film-forming treatment are given exemplary examples. A plurality of treatments may be used. The organic washing treatment is preferable. The treatments can degrease the surface so as to improve the adhesion of surface of the second insulating layer 7.

Next, the second insulating layer 7 is formed. When the second insulating layer 7 is formed, a known chemical vapor deposition apparatus having a vaporization furnace, a cracking furnace, or a vapor deposition chamber is used. First, a compound that is a basic form of the compound represented by the formula (1) under reduced pressure, for example, substituted xylene dimer, is evaporated by heating, and then the evaporated compound passes into the vapor deposition chamber and becomes paralyzed so as to generate diradical monomers. Subsequently, the diradical monomers are deposited on the substrate 8 set in the vapor deposition chamber and subjected to a radical polymerization so as to obtain the second insulating layer 7 that is formed of the compound represented by Formula 1.

The following conditions are specified. The vaporization furnace is preferably at a temperature in the range of 50 to 200° C.

The cracking furnace is preferably at a pressure in the range of 0.1 to 1 Torr and at a temperature in the range of 500 to 1,000° C.

The vapor deposition chamber is preferably in the range of at 0.01 to 0.5 Pa in terms of pressure, in the range of −50 to 50° C. in terms of temperature, and in the range of 0.01 to 1 µm/minute in terms of a film-forming rate, and more preferably in the range of 0.05 to 0.2 Pa in terms of pressure, in the range of 10 to 30° C. in terms of temperature, and in the range of 0.1 to 0.5 µm/minute in terms of a film forming rate.

Under the above conditions, the second insulating layer 7 may be properly formed.

As a result, the second insulating layer 7 that is formed of the compound represented by Formula 1 and has the above described weight-average molecular weight may be obtained on the substrate 8.

Additionally, after the compound represented by Formula 1 is synthesized, a coating method such as a thermal oxidation method, a CVD method, an SOG method, a spin-coating method, or a dip coating method, a printing method such as an ink jet method, or a screening method may be used to form the second insulating layer 7.

[A2] Process of Forming Source Electrode and Drain Electrode

Next, the source electrode 5 and the drain electrode 6 are formed on the second insulating layer 7.

A conducting film is formed on the second insulating layer 7 by using a vacuum film-forming method such as a sputtering method, a chemical vapor deposition (CVD) method such as plasma CVD, thermal CVD, or laser CVD, a dry coating method such as vacuum vapor deposition or ion plating, a wet coating method such as electrolytic plating, immersion plating, or electroless plating, an ink jet method, a thermal spray method, a sol-gel method, or an MOD method. Subsequently, a photo etching is performed so as to form the source electrode 5 and the drain electrode 6.

A mask with predetermined shape may also be used to form the source electrode 5 and the drain electrode 6 by one of the above methods.

Further, when a polymer compound containing conductive particles such as metal fine particles or graphite is used, solution patterning such as by the ink jet method is performed to form a simple and low-cost electrode.

[A3] Process of Forming Organic Semiconductor Layer

Next, the organic semiconductor layer 4 is formed on the second insulating layer 7, the source electrode 5, and the drain electrode 6.

Before the organic semiconductor layer 4 is formed, pre-treatment may be performed in order to improve the adhesion between the semiconductor layer 4 and the second insulating layer 7.

A predetermined organic semiconductor substance is formed on the second insulating layer 7, the source electrode 5, and the drain electrode 6 by using a vacuum vapor deposition method, a spin coating method, a cast method, a pulling method, the Langmuir-Blodgett method, a spraying method, the ink jet method, or a silk-screening method.

[A4] Process of Forming First Insulating Layer

Next, the first insulating layer 3 is formed on the organic semiconductor layer 4.

When the first insulating layer 3 is formed of an inorganic material, the first insulating layer 3 may be formed by, for example, a thermal oxidation method, a CVD method, or a SOG method. By using polysilazane as a raw material, the first insulating layer 3 may be formed of a silica film and a nitrated silicon film by the wet process.

When the first insulating layer 3 is formed of an organic material, a solution containing the organic material or a precursor thereof is coated so as to cover the first insulating layer 3, and then, if necessary, a post-treatment (for example, heating, infrared ray irradiation, ultrasonic waves irradiation, and the like) is performed so as to form the first insulating layer 3. As a method of coating the solution containing the organic material or the precursor thereof onto the first insulating layer 3, a coating method such as a spin coating method and a dip coat method, a printing method such as an ink jet method and the screening method, and the like are given as exemplary examples.

[A5] Process of Forming Gate Electrode

Finally, the gate electrode 2 is formed on the first insulating layer 3.

The gate electrode 2 may be formed of a predetermined electrode material on the first insulating layer 3 by using the same method described in [A2].

The circuit board 1 is formed by the above manufacturing method.

Second Embodiment

The circuit substrate 1 and the manufacturing method thereof according to a second embodiment will be described, and points different from the first embodiment are mainly described and the same points is omitted.

(1) Circuit Board

Figure 2:
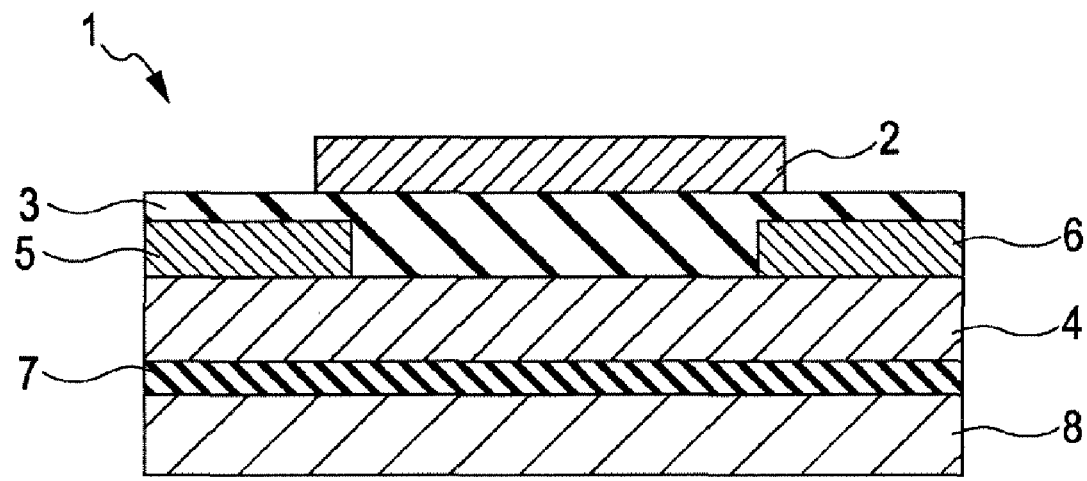
FIG. 2 is a schematic view of a circuit board according to the embodiment.

FIG. 2 is a drawing illustrating a cross-sectional view according to one aspect of the invention. An upper layer indicates "upper", and a lower layer indicates "lower" in FIG. 2.

A circuit board 1 in FIG. 2 constitutes a circuit a gate electrode 2, a first insulating layer 3, an organic semiconductor layer 4, a source electrode 5, a drain electrode 6, a second insulating layer 7, and a substrate 8, but a formed order is different from that of the first embodiment. That is, the circuit board 1 includes a transistor having a top-gate top-contact structure.

(2) Method of Manufacturing Circuit Board

A circuit board 1 may be manufactured as follows, for example.

A method of manufacturing the circuit board 1 shown in FIG. 2 is as follows: a [B1] process of forming a second insulating layer 7 on a substrate 8, a [B2] process of forming an organic semiconductor layer 4 on the second insulating layer 7, a [B3] process of forming a source electrode 5 and a drain electrode 6 on the organic semiconductor layer 4, a [B4] process of forming a first insulating 3 on the source electrode 5, the drain electrode 6, and the organic semiconductor layer 4, and a [B5] process of forming the gate electrode 2 on the first insulating layer 3.

[B1] Process of Forming Second Insulating Layer

The process of forming the second insulating layer 7 is the same as that of [A1] according to the first embodiment.

[B2] Process of Forming Organic Semiconductor Layer

The process of forming the organic semiconductor layer 4 is the same as that of [A3] according to the first embodiment, excepting forming the organic semiconductor layer 4 on the second insulating layer 7.

[B3] Process of Forming Source Electrode and Drain Electrode

The process of forming the source electrode 5 and the drain electrode 6 is the same as that of [A2] according to the first embodiment, excepting forming the organic semiconductor layer 4 on the organic semiconductor layer 4.

[B4] Process of Forming First Insulating Layer

The process of forming the first insulating layer 3 is the same as that of [A2] according to the first embodiment, excepting forming the organic semiconductor layer 4 on the organic semiconductor layer 4.

[B5] Process of Forming Gate Electrode

The process of forming the gate electrode 2 is the same as that of [A5] according to the first embodiment.

The circuit board 1 may be obtained by using the above-manufacturing method.

Electro-Optical Device

Next, an electro-optical device including a circuit substrate according to an aspect of the invention will be described.

The electro-optical elements that are described above are formed on a circuit board in the electro-optical device according to one aspect of the invention, and, a liquid crystal device such as a liquid crystal display device, an organic EL device such as an organic EL display device, and an electrophoresis display device are exemplified.

Hereinafter, the electro-optical device including the circuit board according to an aspect of the invention and the manufacturing method thereof will be described with reference to drawings. As an example, the electrophoresis display device will be described.

(1) Electrophoresis Display Device

Figure 3:
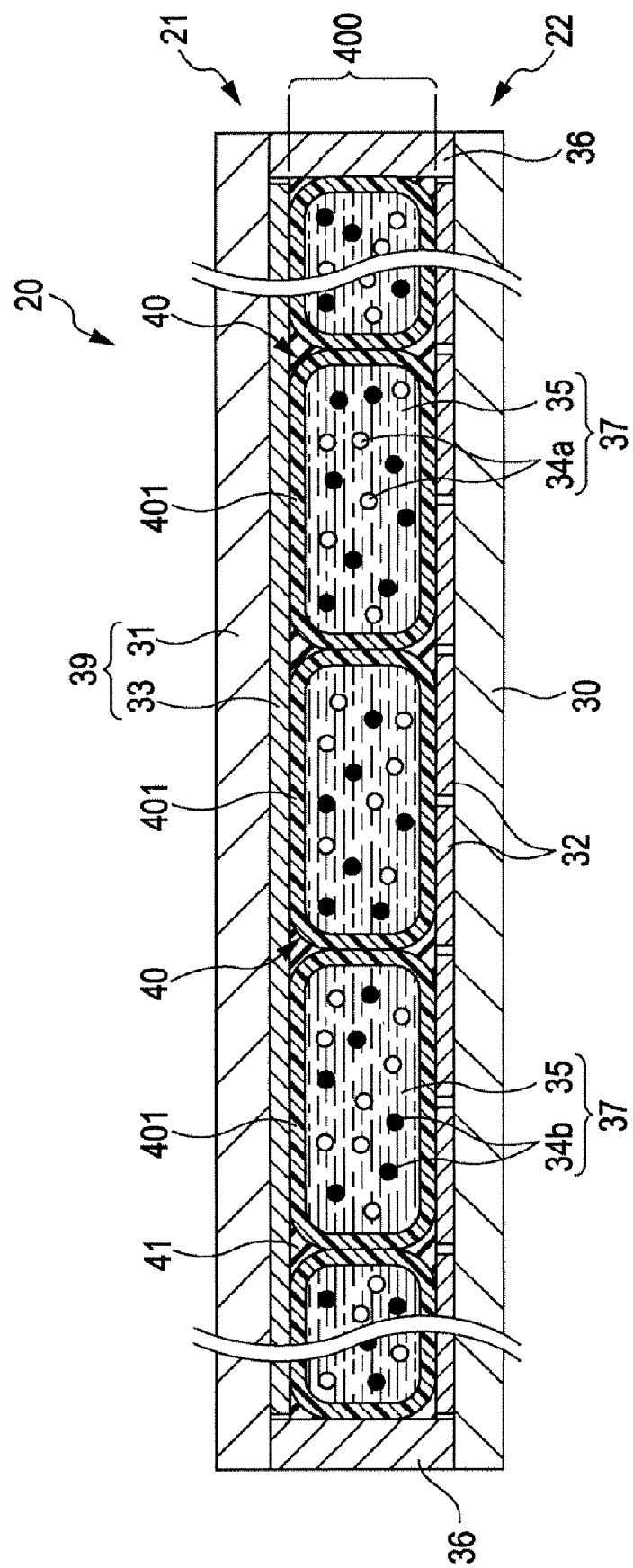
FIG. 3 is a view illustrating an electrophoresis display device according to the embodiment of an electro-optical device.
Figure 4:
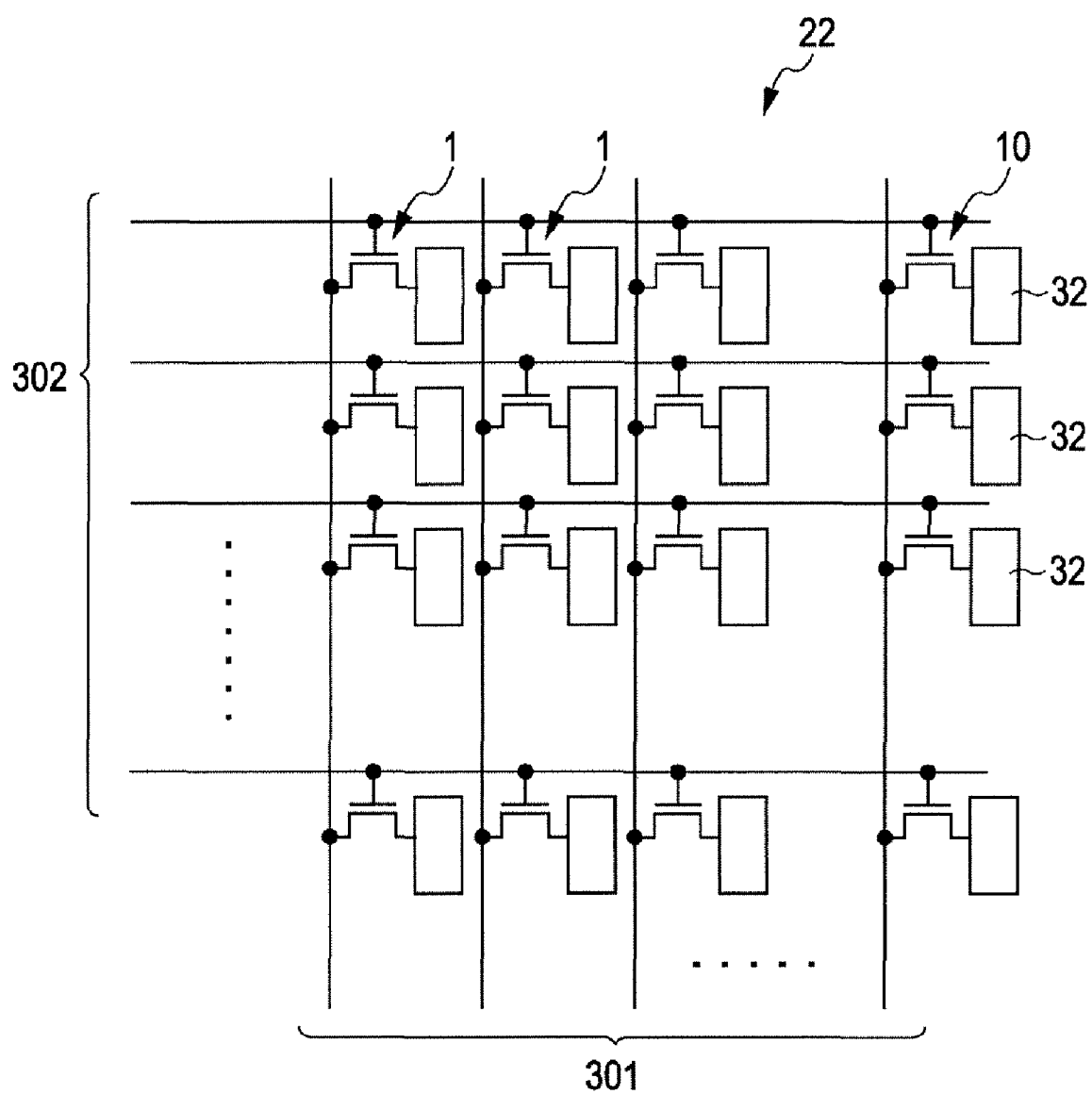
FIG. 4 is a block diagram illustrating an active matrix device.

FIG. 3 is a vertical sectional view illustrating the electrophoresis display device according to the embodiment and FIG. 4 is a block diagram illustrating a configuration of an active matrix device according to one example of the circuit board included in the electrophoresis display device.

An upper surface of FIGS. 3 and 4 indicates "upper" and a lower surface indicates "lower" below, for convenience's sake.

As shown in FIG. 3, the electrophoresis display device 20 includes an electrophoresis display sheet (front plane) 21, an active matrix device (back plane) 22, sealing sections 36 tightly sealing gaps therebetween.

The electrophoresis display sheet 21 includes a substrate 39 which has a plane-shaped base section 31 and a second electrode 33 provided on the lower of the base section 31, and an including layer 400 which is provided on the lower of the substrate 39 and has microcapsules 40 and binder sections 41.

On the other hand, the active matrix device 22 includes a base section 30 and a plurality of electrodes 32 provided the base section 30.

As shown in FIG. 4, the active matrix device 22 includes a plurality of data lines 301, a plurality of scan lines 302 perpendicular to the plurality of data lines 301, transistors 10 around intersections of each of the data lines 301 and the each of the scan lines 302.

Additionally, each of gate sections 6 included in each of the transistors 10 is connected to each of the scan lines 302, each of source sections 2 is connected to each of the data lines 301, and each of drain sections 3, which is described below, is connected to each pixel electrode (a first electrode) 32.

Each capsule 40 encapsulates different types of the electrophoretic particles, that is, two different types of electrophoretic particles 34a and 34b in terms of charge and color, an electrophoretic disperse solution 37 including liquid-phase disperse media 35 according to the embodiment.

A configuration of each section will be described below.

The base sections 30 and 31 are formed of a sheet (in the shape of flat plate) and have a function of supporting and protecting sections disposed therebetween.

Each of the base sections 30 and 31 are formed of what may have a flexible property or a hard property, but what has the flexible property is preferable. By using the base sections 30 and 31 that have the flexible property, the electrophoresis display device 20 may be obtained, that is, the electrophoresis display 20 useful to implement an electronic paper.

When each of the base section (base section layer) 30 and 31 is formed of what has a flexible property, the materials, that is, polyolefin such as polyethylene, polypropylene, ethylene-vinyl acetate copolymer, modified polyolefin, polyamide (for example, nylon 6, nylon 46, nylon 66, nylon 610, nylon 612, nylon 11, nylon 12, nylon 6-12, nylon 6-66), liquid crystal polymer such as thermoplastic polyimide, aromatic polyester, every kind of thermoplastic elastomer such as polyphenylene oxide, polyphenylene sulfide, polycarbonate, polymethylmethacrylate, polyether, polyether ether ketone, polyetherimide, polyacetal, styrene system, polyolefin system, polyvinyl chloride system, polyurethane system, polyester system, polyimide system, polybutadiene system, transpolyisoprene system, fluoro-rubber system, chlorinated polyethylene system, or copolymer, a blended substance, a polymer alloy, and the like mainly including these substances are exemplified, and one or two or more type of substances may be used.

An average thickness of the base sections 30 and 31 is properly defined according to a configuration substance, usage, and the like, and is particularly not limited. However, when the base sections 30 and 31 have the flexible property, thickness of the base sections 30 and 31 is preferably 20 to 500 μm or so, more preferably in the range of 25 to 250 μm or so. Accordingly, the electrophoresis display device 20 may have a flexible and strong property as well as small property (especially, thin).

The first electrodes 32 and the second electrode 33 formed of a layer (in the shape of thin) are provided on sides of the microcapsule 40, that is, on the upper of the base section 30 and the lower of the base section 31, respectively.

When a voltage is applied between the first electrodes 32 and the second electrode 33, an electric field occurs therebetween and the electric field influences the electrophoretic particles (display particle) 34a and 34b.

According to the embodiment, the second electrode 33 is a common electrode and each of the first electrodes 32 is an individual electrode (pixel electrode connected to a switching element) arranged of a matrix (in the shape of line-column).

Each of overlapped parts of the second electrode 33 and each of the first electrodes 32 is formed of one pixel.

Further, the second electrode 33 may be divided into a plurality of electrodes as the same as the first electrodes 32.

Additionally, the first electrodes 32 may be divided into the shape of stripe, and the second electrode 33 may also be divided into the shape of the stripe so as to be intersected.

Materials formed of each of the electrodes 32 and 33 are not particularly limited so long as the materials have a conductive property. A metal substance such as copper, aluminum, nickel, cobalt, platinum, gold, silver, molybdenum, tantalum or alloyed metal containing these substances, carbonaceous substance such as carbon black, carbon nanotube, fullerene, an electronic-conductive polymer substance such as polyacetylene, polypyrrole, polythiophene, polyaniline, poly(p-phenylene), poly(p-phenylenevinylene), polyfluorene, polycarbazole, polysilane, or derivatives of these substance, an ionic-conductive polymer substance in which an ionic substance such as NaCl, $LiClO_4$, KCl, $H_2O$, LiCl, LiBr, LiI, $LiNO_3$, LiSCN, $LiCF_3SO_3$, NaBr, NaI, NaSCN, $NaClO_4$, $NaCF_3SO_3$, KI, KSCN, $KClO_4$, $KCF_3SO_3$, $NH_4I$, $NH_4SCN$, $NH_4ClO_4$, $NH_4CF_3SO_3$, $MgCl_2$, $MgBr_2$, $MgI_2$, $Mg(NO_3)_2$, $MgSCN_2$, $Mg(CF_3SO_3)_2$, $ZnCl_2$, $ZnI_2$, $ZnSCN_2$, $Zn(ClO_4)_2$, $Zn(CF_3SO_3)_2$, $CuCl_2$, $CuI_2$, $CuSCN_2$, $Cu(ClO_4)_2$, or $Cu(CF_3SO_3)_2$ is dispersed in a matrix resin such as polyvinyl alcohol, polycarbonate, polyethylene oxide, polyvinyl butyral, polyvinyl carbazol, vinyl acetate, a conductive oxide substance such as indium tin oxide (ITO), fluorene-doped tin oxide (FTO), tin oxide ($SnO_2$), or indium oxide (IO), and every kind of conductive substance are exemplified. One or two or more type of substances may be used.

An average thickness of the electrodes 32 and 33 is properly defined according to a configuration substance, usage, and the like, and is particularly not limited. However, the average thickness is preferably 0.05 to 10 μm or so, more preferably 0.05 to 5 μm or so.

In each base sections 30 and 31, each of the base sections and the electrodes disposed on a display side and each of the electrodes 32 and 33 have an optical transparency, that is, practically transparent property (transparent and colorless, transparent and colored, or semi-transparent). A state of the electrophoretic particles 34a and 34b in the electrophoretic disperse solution 37 described below, that is, an information displayed on the electrophoresis display device 20, can be easily distinguished.

The including layer 400 including the microcapsules is provided so as to contact the lower of the second electrode 33 in the electrophoresis display sheet 21.

The including layer 400 has the plurality of microcapsules 40 and each of the microcapsules 40 in which each of the electrophoretic disperse solutions 37 is sealed in each of capsule bodies (shell bodies) 401 is fixed by each of the binder sections 41.

Each of the microcapsules 40 is disposed in a single layer between the active matrix device 22 and the substrate 39, so as to be formed parallel in the vertical and horizontal direction.

According to the embodiment, each of the first electrodes 32 and the second electrode 33 are interposed such that each of the microcapsules 40 is compressed in a top and bottom directions and is spread in the horizontal direction. That is, each of the microcapsules 40 is formed in the shape of a stone wall when viewing the plane.

In the electrophoresis display device 20, an effective display area increases and a contrast becomes good. Since a movement distance of the electrophoretic particles 34a and 34b in the top and bottom direction may be shorten, the electrophoretic particles 34a and 34b move around a predetermined electrode at a short time, thereby improving a response speed.

As a configuration material of each of the capsule bodies (shell bodies) 401, for example, gelatin, composite substance of Arabic gum and the gelatin, every kind of resin substances such as urethane-based resin, melamine-based resin, urea resin, polyimide, and polyether are exemplified, and one or two or more type of substances may be used.

Each of the microcapsules 40 is preferably formed to be almost uniformed. Accordingly, the electrophoresis display device 20 may prevent display stains from occurring or decreases them so as to improve an excellent display performance.

At least one kind of each of the electrophoretic particles is dispersed (suspension) to the liquid-phase disperse media 35 such that each of the electrophoretic disperse solutions 37 in each of the capsule bodies 401 is formed.

Each of the electrophoretic particles 34a and 34b has charges and are influenced by the electric field. As the liquid-phase disperse media 35, any particle (charged particles) that can move by electricity may be used and is not particularly limited. However, at least one kind particle in pigment particles, resin particles, or particles mixed thereby is properly used. The particles have advances to rather easily control the charges as well as to be easily manufactured.

As a pigment that forms the pigment particles, a black pigment such as aniline black, carbon black, titanium black, a white pigment such as titanic oxide, antimony oxide, barium sulfate, zinc sulfate, zinc oxide, silicon oxide, aluminum oxide, an azole-based pigment such as monoazo, disazo, polyazo, a yellow-colored pigment such as insoindolinone, chromium yellow, yellow-colored iron oxide, cadmium yellow, titan yellow, antimone, a red-colored pigment such as quinacridone red, chromiumvermilion, a blue-colored pigment such as phthalocyanine blue, indanthrene blue, iron blue, ultramarine blue, cobalt blue, and a green-colored pigment such as phthalocyanine green are exemplified, and one or two or more type of substances may be used.

As a resin substance that forms the resin particles, an acryl-based resin, a urethane-based resin, a urea-based resin, an epoxy-based resin, polystyrene, and polyester are exemplified, and one or two or more type of substances may be used.

As the mixed particles, a particle in which a surface of a pigment particle is coated by a pigment substance or other pigments, a particle in which a surface of a pigment particle is coated by a pigment, a mixture in which a pigment and a resin substance are mixed at a proper proportion, and the like are exemplified.

An average particle diameter of the electrophoretic particles 34a and 43b is preferably 0.1 to 10 μm or so, more preferably 0.1 to 7.5 μm or so. Due to the average particle diameter of the electrophoretic particles 34a and 43b, cohesion of the electrophoretic particles 34a and 34b or precipitation in the liquid-phase disperse media 35 may be prevented. Accordingly, the electrophoresis display device 20 may prevent a display quality from being degraded.

On the other hand, each of the liquid-phase disperse media 35 that has low solubility to each of the capsule bodies 401 and has a relatively high insulating property may be properly used. Further, each of the liquid-phase disperse media 35 is formed of an organic substance that has low polarity or has little polarity (aprotic disperse media).

As the liquid-phase disperse media 35, a kind of ester such as methyl acetate, ethyl acetate, butyl acetate, formic ether, a kind of ketone such as acetone, methyl ethyl ketone, diethyl ketone, methyl isobutyl ketone, methyl isopropyl ketone cyclohexanone, a kind of aliphatic hydrocarbon (liquid paraffin) such as pentane, hexane, octane, a kind of hydrocarbon such as cyclohexane, methylcyclohexane, a kind of alicyclic aromatic hydrocarbon such as a kind of benzene having long-chain alkyl group such as benzene, toluene, xylene, hexyl benzene, heptyl benzene, octyl benzene, nonyl benzene, decyl benzene, undecyl benzene, dodecyl benzene, tridecyl benzene, tetradecyl benzene, a kind of halogenated hydrocarbon such as methylene chloride, chloroform, carbon tetrachloride, 1,2-dichloroethane, a kind of multi-ring aromatic such as pyridine, pyrazine, furan, pyrrole, thiophene, methylpyrrolidone, a kind of nitrile such as acetonitrile, propionylnitrile, acrylonitrile, a kind of amide such as N,N-dimethylformamide, N,N-demethylacetoneamide, carboxylate salt, and other kinds of oil are exemplified, and the simple substance or a mixture thereof may be used.

The dispersion to the liquid-phase disperse media 35 of the electrophoretic particles 34a and 35b may be performed by using one method or a combination of two or more methods, for example, in a paint shaker method, a ball mill method, media mill method, an ultrasonic dispersion method, an agitator disperse method.

It is preferable that specific gravity of the electrophoretic particles 34a and 34b is almost same as that of the liquid-phase disperse media 35. Accordingly, even when applying a voltage between the electrodes 32 and 33 stops, the electrophoretic particles 34a and 34b in the liquid-phase disperse solution 35 may remain for a long time. That is, an information displayed on the electrophoresis display device 20 stores for a long time.

Each of the binder sections 41 is provided to bond the active matrix device 22 and the substrate 39 and the active matrix device 22, the substrate 39, and each of the microcapsule 40 and to insulate an area between the electrodes 32 and 33. Accordingly, durability and reliability of the electrophoresis display device 20 may be improved.

In each of the binder sections 41, a resin substance affinity (adhesion) and insulation property are good may be used when each of the binder sections 41 is bonded to each of the electrodes 32 and 33 and the each of the capsule bodies 401 (microcapsule 40).

As a substance of each of the binder section 41, polyethylene, a thermoplastic resin such as chlorinated polyethylene, ethylene-vinyl acetate copolymer, ethylene-ethyl acrylate copolymer, polypropylene, an AS resin, an ABS resin, a methyl methacrylate resin, a vinyl chloride resin, a vinyl chloride-vinyl acetate copolymer, a vinyl chloride-vinylidene copolymer, vinyl chloride acrylic ester copolymer, vinyl chloride-methacrylic acid copolymer, vinyl-acrylonitrile copolymer, ethylene-vinylalcohol-vinyl chloride copolymer, propylene-vinyl chloride copolymer, a vinylidene chloride resin, a vinyl acetate resin, polyvinylalcohol, polyvinyl formal, and cellulose-based resin, a high molecule such as a polyamide-based resin, polyacetal, polycarbonate, polyethylene terephthalate, polybutylene terephthalate resin, polyphenylene oxide, polysulphone, polyamide-imide, polyaminobismaleimide, polyether sulfone, polyphenylene sulfone, polyarylate, grafted polyphenylene ether, polyether ketone, and polyetherimide, a fluorene-based resin such as polytetrafluoroethylene, polyfluoroethylenepropylene, tetrafluoroethylene-perfluoroalcoxyethylene copolymer, ethylene-tetrafluoroethylene copolymer, polyfluorovinylidene, polytrifluoro ethylene, and fluoro-rubber, a silicon-based resin such as a silicon resin and silicon rubber, a urethane-based resin such as polyurethane, every type of resin substances such as methacrylic acid-styrene copolymer, polybutylene, and methacrylic acid methyl-butadien-styrene copolymer are exemplified, and one or two or more type of substances may be used.

The seal sections 36 are provided between and along the base sections 30 and 31. Each of the seal sections 36 tightly seals each of the electrodes 32, the electrode 33, and the microcapsules including layer 400. Accordingly, moisture may be prevented in the electrophoresis display device 20, thereby more preventing the electrophoresis display device 20 from degrade.

As a configuration substance of each of the seal sections 36, a thermoplastic resin such as acryl-based resin, urethane resin, and an olefin resin, a thermo-hardening resin such as an epoxy-based resin, a melamine-based resin, a phenol-based resin, and other type of resins are exemplified, and one or two or more type of substances may be used.

Additionally, the seal sections 36 are provided whenever necessary and may be omitted.

In the electrophoresis display device 20, a selection signal is provided for one or a plurality of scan lines 302. Each of the transistors 10 that is connected to each of the scan lines 302 for which the selection signal (selection voltage) is provided and each of the transistors 10 becomes ON.

Accordingly, each of the data lines 301 and each of the pixel electrodes 32 connected to a corresponding one of the transistors 10 become electrically conductive. In this case, when a desired data (voltage) is provided for each of the data lines 301, the data (voltage) is provided for the each of the pixel electrodes 32.

The electric field occurs between each of the pixel electrodes 32 and the second electrode 33 and each of the electrophoretic particles 34a and 34b electrically move toward several electrodes according to a direction and strength of the electric field, and a property of the electrophoretic particles 34a and 34b.

On the other hand, when providing the selection signal (selection voltage) stops, each of the transistors 10 become OFF, and each of the data lines 301 and each of the pixel electrodes 32 connected to each of the transistors 10 do not become electrically conductive.

Accordingly, by properly controlling to provide or stop the selection signal to each of the scan lines 302, or to provide or stop the data to each of the data lines 301, a desired image (information) may display on the electrophoresis display sheet 21 of the electrophoresis display device 20.

In particular, since colors of the electrophoretic particles 34a and 34b according to the embodiment, a multiple-tone image may display.

Since the electrophoresis display device 20 according to the embodiment has the active matrix device 22, it is possible that each of the transistors 10 connected to each of the scan lines 302 becomes ON or OFF selectively. Accordingly, it is difficult for cross talk to occur, and a circuit may operate fast, thereby obtaining a high-quality image (information).

Since the electrophoresis display device 20 according to the embodiment may operate under low driving voltage, electricity may be saved.

As long as a method of manufacturing the circuit board of an aspect of the invention is included, a method of manufacturing the electric-optical device is not particularly limited, and a commonly used method may be used.

(2) Method of Manufacturing Electrophoresis Display Device

Figure 5A:
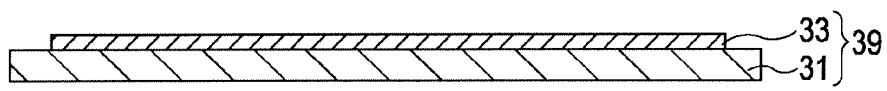
FIGS. 5A, 5B, 5C, 5D, 5E, 5F are schematic diagrams illustrating a method of manufacturing an electrophoresis display device in FIG. 3.
Figure 5B:
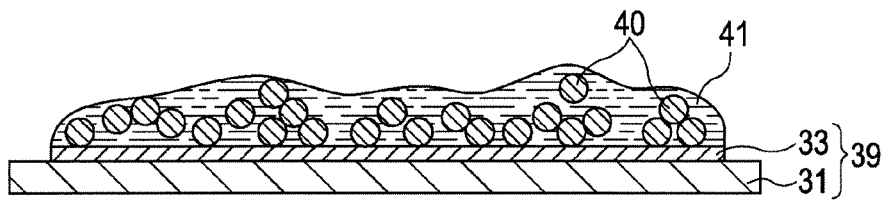
Figure 5C:
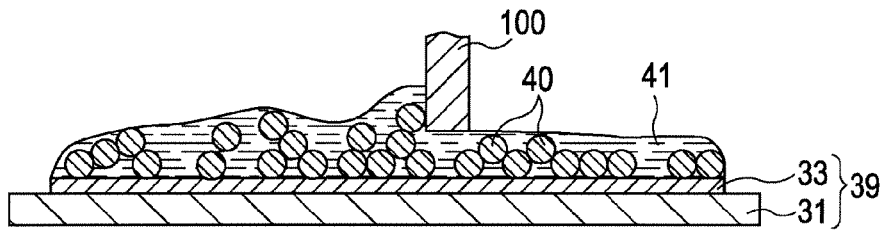
Figure 5D:
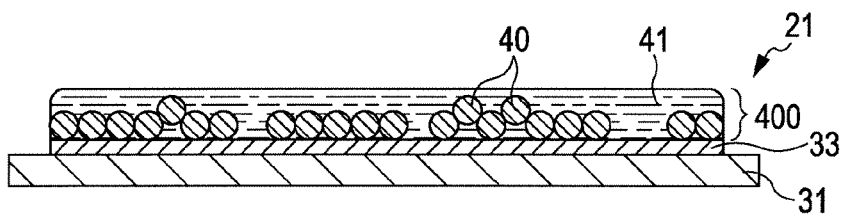
Figure 5E:
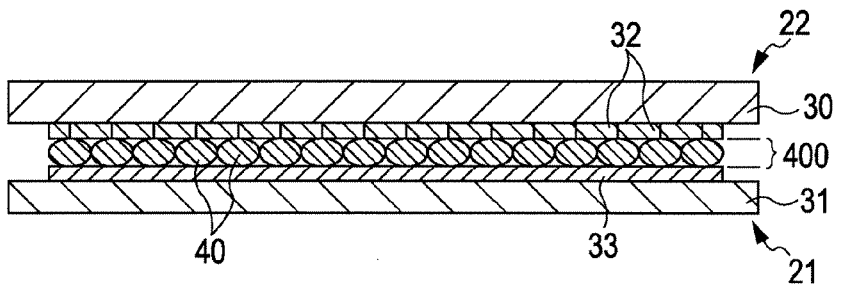
Figure 5F:
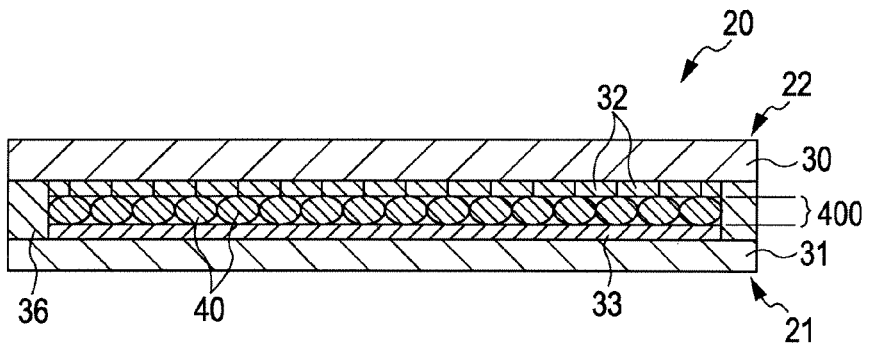

FIGS. 5A to 5F are schematic views illustrating a method of manufacturing the electrophoresis display device shown in FIG. 3. In FIGS. 5A and 5F, each of upper surfaces indicates "the upper", and each of lower surfaces indicates "the lower".

[C1] Process of Manufacturing Microcapsule 40

First, each of the microcapsule 40 sealed in the electrophoretic disperse solutions 37 is manufactured.

A method of manufacturing each of the microcapsules 40 (method of sealing the electrophoretic disperse solutions 37 of a corresponding one of the capsule bodies 401) is not particularly limited, but for example, every kind of microcapsule methods such as an interfacial polymerization method, an IN-situ polymerization method, a phase separation method, an interfacial-precipitation method, a spray dry method may be used.

By using, for example, a screening and selecting method, a filtering method, a method of classifying a difference in specific gravity, and the like, a regular size of each of the microcapsules 40 may be obtained.

An average particle diameter of each of the microcapsules 40 is preferably 20 to 200 μm or so, more preferably in the range of 30 to 100 μm or so. Due to the average particle diameter of each of the microcapsules 40, an electrical movement of the electrophoretic particles 34a and 34b in the electrophoresis display device 20 may be more controlled.

[C2] Method of Manufacturing Microcapsule Disperse Solution

Next, according to the above-method, the manufactured microcapsules 40, the binder sections 41, and the microcapsule disperse solutions containing disperse media are manufactured.

As the disperse media, a solvent (water-based solvent) that have a high hydrophilic nature (that is, low hydrophobic) is preferable. As the water-based solvent, water such as distilled water and purified water, a kind of low alcohol such as methanol, ethanol, isopropanol, and butanol are exemplified, and water is particularly preferable. The low alcohol may have a substituent with low hydrophobic such as a methoxy group and the like. When the water-based solvent is used, permeation of the solvent in each of the microcapsules 40 is prevented, thereby preventing each of the microcapsules 40 from swelling or solving.

A concentration (content) of each of the binders 41 in each of the microcapsule disperse solutions without each of the microcapsules 40 is preferably 50 wt % or less, more preferably in the range of 0.05 to 25 wt % or so.

By setting the concentration of each of the binders 41 in the above way, a viscosity of each of the microcapsule disperse solution may have a property value. Additionally, in a process of providing each of the microcapsule disperse solution so as to fill a gap as described below, it is possible to easily and surely move each of the microcapsules 40.

The viscosity of each of the microcapsule disperse solution is preferably 1 to 1000 cP (25° C.) or so, more preferably in the range of 2 to 700 cP (25° C.) or so.

A content of each of the microcapsules 40 in the microcapsule disperse solution is preferably 10 to 80 wt % or so, more preferably in the range of 30 to 60 wt % or so.

When the content of each of the microcapsules 40 is set in the above way, it is advantageous that the each of the microcapsules 40 moves (rearrange) and is disposed so as not to overlap in two direction (in single layer) in the microcapsule including layer 400.

[C3] Process of Forming Microcapsule Including Layer

Next, as shown FIG. 5A, the substrate 39 is provided.

As shown FIG. 5B, the microcapsule disperse solution is provided on the substrate 39.

A method of providing the microcapsule disperse solution, for example, a spin coat method, a spray coat method, and every type of coating methods, may be used.

Next, whenever necessary, each of the microcapsules 40 is evenly arranged by one and one without being overlapped in the two direction such that a thickness (amount) of the microcapsule disperse solution in each section of the substrate 39 becomes uniformed.

For example, as shown in FIG. 5C, a squeegee (jig in the shape of a flat) 100 passes on the substrate 39 so as to sweep each of the microcapsules 40.

Accordingly, the microcapsule including layer 400 is formed, thereby obtaining the electrophoresis display sheet 21 as shown FIG. 5D.

[C4] Process of Bonding Active Matrix Device 22

As shown in FIG. 5E, the active matrix circuit board 22, which is a circuit board 1 manufactured in the method of manufacturing the circuit board 1 according to an aspect of the invention, is overlapped such that the first electrode 32 contacts on the microcapsule including layer 400.

Accordingly, the electrophoresis display sheet 21 and the active matrix device 22 are bonded with the microcapsule including layer 400 interposed therebetween.

[C5] Process of Sealing

Next, as shown in FIG. 5F, the sealing sections 36 are formed along edges of the electrophoresis display sheet 21 and the active matrix device 22.

The sealing sections 36 exist between the electrophoresis display sheet 21 and the active matrix device 22, and a substance for forming each of the sealing sections 36 along the edges thereof is provided by, for example, a dispenser and is hardened to be formed.

The electrophoresis display device 20 is obtained by using the above processes.

Electronic Apparatus

Next, an electric apparatus including a circuit board according to an aspect of the invention will be described.

For example, the electric apparatus according to an aspect of the invention includes a personal computer (mobile type of a personal computer), a mobile phone, a digital still camera, a television, a video camera, a view finder type or monitor direct vision-type video tape recorder, a laptop personal computer, a car navigation apparatus, a pager, an electronic pocket book (capable communicating), an electronic dictionary, a calculator, an electronic game apparatus, a word processor, a work station, a television phone, an TV monitor for security, a security TV monitor, an electronic binocular, a PCS terminal, an apparatus having a touch panel (for example, a cash dispenser and an automatic ticket machine in a banking facilities), a clinical instrument (for example, an electronic thermometer, a blood pressure meter, a blood glucose meter, a cardiograph display apparatus, an ultrasonic diagnostic (imaging) equipment, an endoscope display device), a fish-detector, every type of measuring instruments, a type of a meter (for example, a type of meters of a vehicle, an aircraft, a ship), a flight simulator, every type of monitors, a projection type display apparatus, and the like.

(1) Electronic Paper

Figure 6:
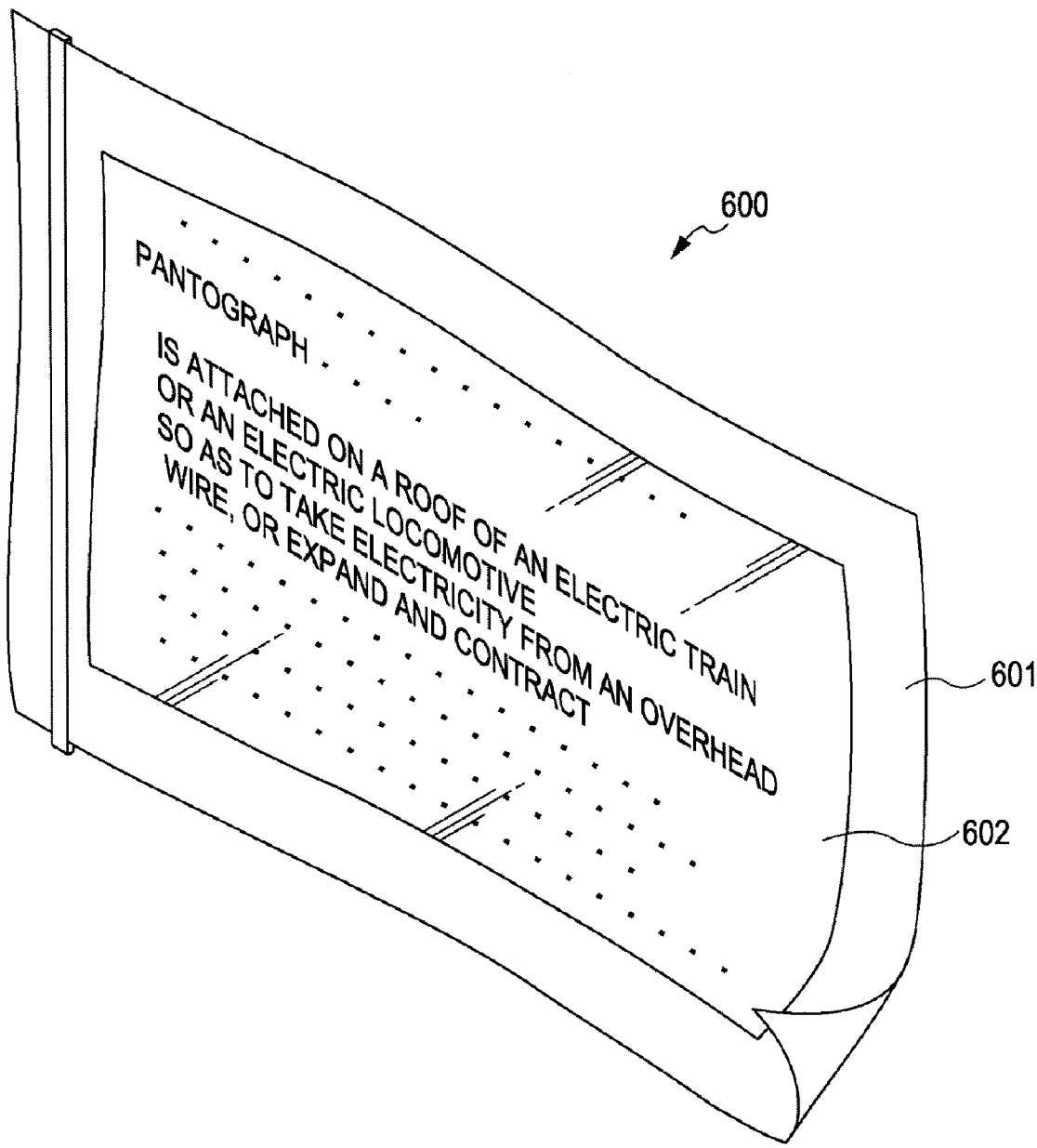
FIG. 6 is a schematic diagram illustrating an electron paper according to the embodiment of an electronic apparatus.

FIG. 6 is a perspective view illustrating an electronic paper according to the electronic apparatus of the invention.

An electronic paper 600 shown in the drawing has a main body 601 constituting a rewritable sheet that has a texture of paper and a flexible property and a display unit 602.

In the electronic paper 600, the display unit 602 includes the above-described electrophoresis display device 20.

A method of manufacturing the electronic paper is not particularly limited as long as the method of manufacturing the circuit board according an aspect of the invention or the method of manufacturing the electro-optical device including the method of manufacturing the circuit board according an aspect of the invention are included, and any commonly used method may be used.

(2) Display

Figure 7A:
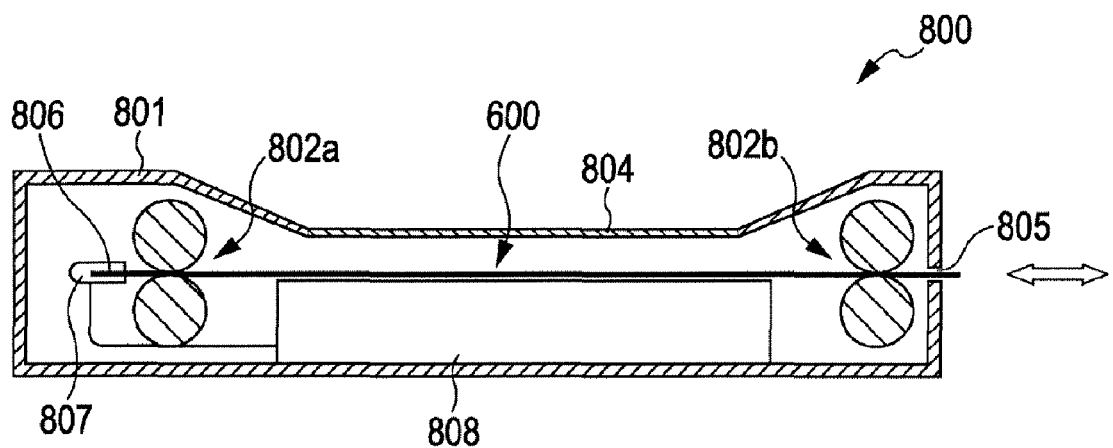
FIGS. 7A and 7B are schematic diagrams illustrating a display according to the embodiment of an electronic apparatus.
Figure 7B:
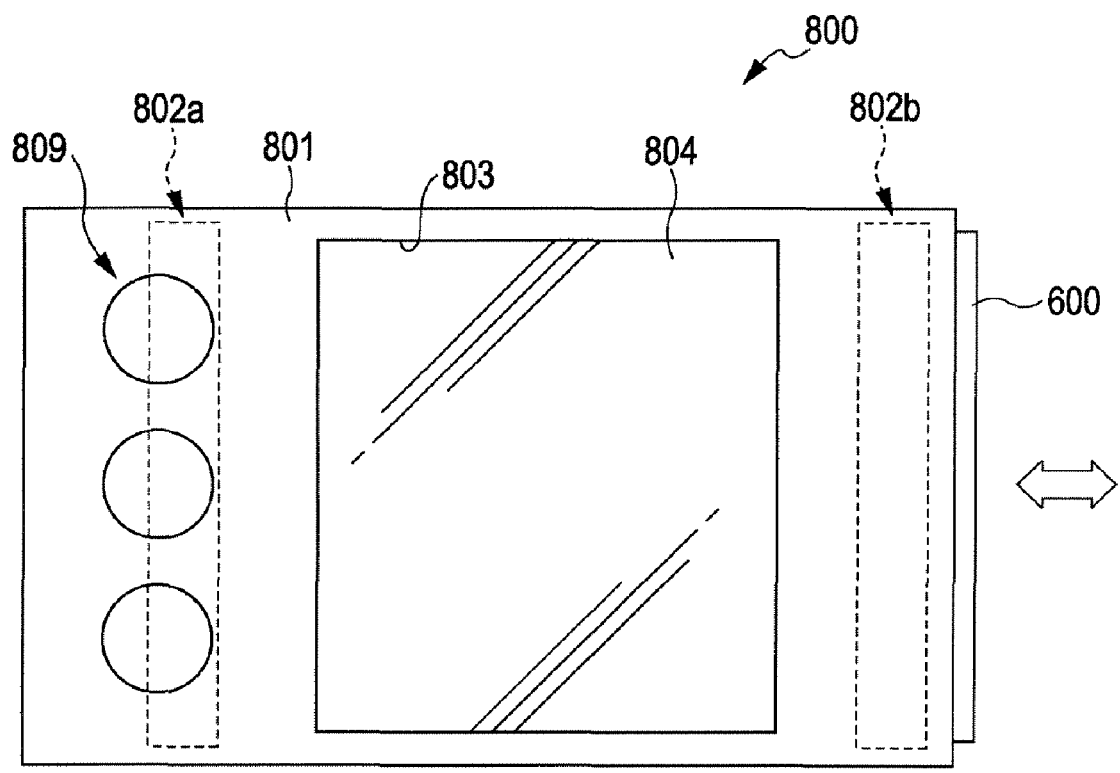

FIGS. 7A and 7B are views illustrating the electronic apparatus, a display, according an aspect of the invention.

The display 800 shown in the drawing includes a main section 801 and an electronic paper 600 that may be inserted into or pulled out the main section 801. Additionally, the electronic paper 600 is formed in the same way in FIG. 6.

In the main section 801, an inserting section 805 is formed on the side (right side in the drawing) so as to insert the electronic paper 600, and two pairs of carrying sections 802a and 802b are provided inside the main section 801. When the electronic paper 600 is inserted into the main section 801 through the inserting section 805, the electronic paper 600 is interposed by two pairs of the carrying sections 802a and 802b so as to be installed.

A rectangular-shaped hole section 803 is formed on a display side (on the face of a sheet of paper in FIG. 7B) of the main section 801 and a transparent glass plate 804 put in the hole section 803. Accordingly, the electronic paper 600 which is inserted from an exterior of the main section 801 may be distinguished. That is, the display 800 constitutes the display surface such that the electronic paper 600 on the transparent glass plate 804 may be distinguished.

A terminal section 806 is provided in an end section (left side of the drawing) of the electronic paper 600 and a socket 807 connected to the terminal section 806 is provided inside the main section 801, when the electronic paper 600 is inserted into the main section 801. A controller 808 and an operating section 809 are electrically connected to the socket 807.

The electronic paper 600 is installed in the main section 801 of the display 800 in order to be inserted or pulled out. Accordingly, the electronic paper 600 is portable when the electronic paper 600 separates.

Additionally, in the display 800, the electronic paper 600 constitutes the electrophoresis display device 20 described above.

It is preferable that the display 800 in which the circuit board 1 is used for the active matrix device according to an aspect of the invention is used, since an aperture ratio of the display may improve.

A method of manufacturing the display 800 is not particularly limited as long as the method of manufacturing the circuit board according an aspect of the invention or the method of manufacturing the electro-optical device including the method of manufacturing the circuit board according an aspect of the invention are included, and any commonly used method may be used.

The circuit, the manufacturing method thereof, and the electro-optical device and the electronic apparatus including the circuit and the manufacturing method are described above, but the present invention is not particularly limited to these.

In the circuit board according to an aspect of the invention, any layer which has a purpose may be provided and may contact any layer so long as the layer meets a predetermined condition.

In the method of manufacturing the circuit board according to an aspect of the invention, any other process may be included so long as the process exerts an effect according to the invention.

Example 1

Process Manufacturing Thin-Film Transistor
Example 1

<1> Process Forming Second Insulating Layer

A polyethylenenaphthalate substrate (by made Teijin DuPont Films; Teonex Q65®) was washed by an isoproyl alcohol solvent by using ultrasonic waves for ten minutes, degreasing a surface was performed.

Next, by introducing a substrate in a device for forming film of poly-p-xylylene, a film was formed. That is, chloro-p-xylylenedimer was introduced in a vaporization furnace set at the pressure (0.7 Torr) and at the temperature of 180° C. so as to heat and vapor. Next, the vapored compound passes into a cracking furnace heated under 0.5 Torr and at 650° C. so as to be pryrolized and generate radical monomers. The pressure lowered under 0.05 Torr, the generated radical monomers were introduced in a vapor deposition chamber, and the generated radical monomer was vapor-deposited at a rate of 0.1 μm/minute on the substrate that set in the vapor deposition chamber so as to form the second insulating layer constituting poly-(chloro)-p-xylylenedimer of 500 nm in terms of thickness.

<2> Process Forming Source Electrode and Drain Electrode

Cr was vacuum-deposited on the second insulating layer as a closely attaching layer at 10 nm, and Au was vacuum-deposited at 1000 nm. By using photoresist (made by TOKYO OHKA KOGYO CO., LTD.), photo-etching of Au and Cr was performed. After a source and drain electrodes that have the channel length of 50 μm and 200 μm were patterned so as to be formed, resister was desquamated.

<3> Process Forming Organic Semiconductor Layer

A plasma-processing device set at 200 W of a RF power and 100 sccm of oxygen flux processed oxygen plasma for 5 minutes and washing the substrate obtained in the step <2> was performed. A toluene solution that has the amount of 1 wt % of poly-9,9-dioxtyl fluorene-co-dithiophene (F8T2) was coated on the corresponding substrate by a spin coating method (2400 rpm). An organic semiconductor layer was formed at 40 nm in terms of film thickness after drying at the temperature of 60° C. for 10 minutes.

<4> Process Forming First Insulating Layer

A butyl acetate solution that has polymethylmeth acrylate (PMMA) of the amount of 10 wt % was coated on the organic semiconductor layer by the spin coating method (2400 rpm). A gate insulating layer having PMMA the film thickness of 1000 nm was formed after drying at the temperature of 60° C. for 10 minutes.

<5> Process Forming Gate Electrode

A gold particles-disperse solution in which gold particles (made by NIPPON MUKI CO., LTD.) of 10 nm in diameter was dispersed in toluene was coated in an area between the source electrode and the drain electrode of the first insulating layer by an ink jet method. The gate electrode was formed in the film thickness of 1000 nm after drying at the temperature of 80° C. for 10 minutes.

By the above processes, a top-gate and bottom-contact type of thin film transistor in which the second insulating layer was formed of poly-(chloro)-p-xylylene was obtained.

Example 2

The chloro-p-xylylenedimer of the example 1 was substituted by dichloro-p-xylylenedimer, and by performing as the same as the example 1, a circuit board having the top-gate and bottom-contact type of thin film transistor in which the second insulating layer was formed of poly-(chloro)-p-xylylene was obtained.

Comparative Example 1

The chloro-p-xylylenedimer of the step <1> of the example 1 was substituted by dichloro-p-xylylenedimer, and by performing as the same as the example 1, a circuit board having the top-gate and bottom-contact type of thin film transistor in which the second insulating layer was formed of poly-p-xylylene was obtained.

Comparative Example 2

The second insulating layer of the step <1> of the example 1 was not formed, and by performing as the same as the example 1, a circuit board having the top-gate and bottom-contact type of thin film transistor was obtained.

2. Evaluation

The transfer property of the circuit board having the top-gate and bottom-contact type of thin film transistor was evaluated by using a semiconductor-parameter analyzer (made by Agilent Technologies: 4156C). The evaluation condition is that a drain voltage was applied at −40 V of and a gate voltage was switched from +40 V to −40 V so as to evaluate drain current. The result is shown in table 1 and FIG. 8. Additionally, each item of table 1 was evaluated by using the following methods.

(1) OFF Current

When the gate voltage is 0, the current was evaluated from a diagram (FIG. 8) showing a relationship of a gate voltage and drain current.

(2) ON-OFF Ratio

When the gate voltage is 0 V and −40 V, the ON-FF ratio was evaluated from the drain current ratio.

(3) Mobility

A threshold voltage was evaluated from an intercept of the graph in which ½ power of the drain current is a vertical axis and the gate voltage is a horizontal axis, and a mobility of the transistor in a saturation area was evaluated from an inclination of the straight line.

TABLE 1

| | Second insulating layer | OFF Current (A) | ON-OFF Ratio | Mobility (cm²/Vs) | Threshold Voltage (V) |
|---|---|---|---|---|---|
| Example 1 | poly-(chloro)-p-xylylene | $1 \times 10^{-13}$ | $4 \times 10^6$ | $2.2 \times 10^{-3}$ | −4 |
| Example 2 | poly-(dichloro-p-xylylene) | $1 \times 10^{-13}$ | $1 \times 10^7$ | $4.5 \times 10^{-3}$ | −2 |
| Comparative Example 1 | poly-p-xylylene | $2 \times 10^{-13}$ | $1 \times 10^6$ | $0.5 \times 10^{-3}$ | −12 |
| Comparative Example 2 | none | $8 \times 10^{-13}$ | $2 \times 10^4$ | $1.0 \times 10^{-4}$ | −22 |

Figure 8:
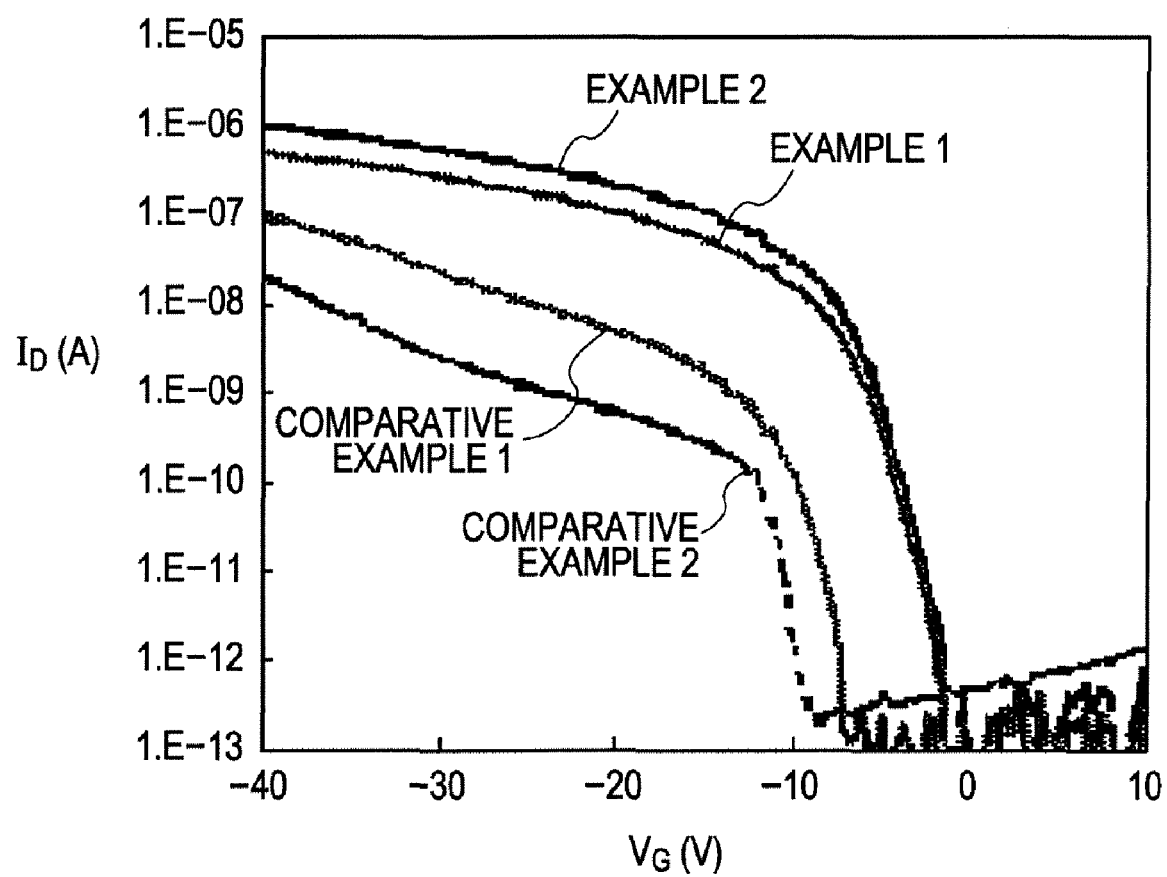
FIG. 8 is a diagram showing a relationship of gate voltage and drain current.

As shown in FIGS. 1 and 8, the result of the OFF current, the ON-OFF ratio, the mobility, and the threshold voltage all in the two examples was good, comparing in the comparative examples. Further, the circuit board having the transistor has a high performance and a high reliability was obtained. In particular, the effect in the examples 1 and 2 was excellent.

What is claimed is:

1. A circuit board, comprising:
a source electrode, a drain electrode, and a gate electrode provided above a surface of a substrate;
a first insulating layer insulating the source electrode and the drain electrode from the gate electrode;
an organic semiconductor layer provided under the first insulating layer so as to contact the first insulating layer; and
a second insulating layer provided under the organic semiconductor layer so as to contact the organic semiconductor layer,
wherein the first and second insulating layers each include a compound represented by Formula 1,

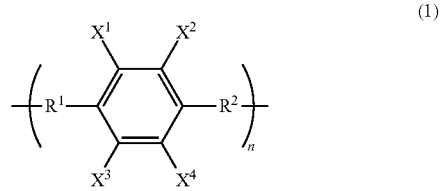

where $R^1$ and $R^2$ each independently represent a substituted or unsubstituted alkylene group; $X^1$, $X^2$, $X^3$, and $X^4$ each represent hydrogen or an electrophilic group but are not all hydrogen; and n represents a number in the range of 100 to 100,000; and
wherein at least one of $X^1$, $X^2$, $X^3$, and $X^4$ is an electrophilic group selected from the group consisting of an —OH group, an —NO₂ group, a phenyl group, and an —SH group.

2. The circuit board according to claim 1, wherein the alkylene group has a carbon number in the range of 1 to 10.

3. The circuit board according to claim 1, wherein any two of $X^1$, $X^2$, $X^3$, and $X^4$ are the electrophilic group.

4. The circuit board according to claim 1, wherein another of $X^1$, $X^2$, $X^3$, and $X^4$ is an electrophilic group selected from the group consisting of a halogen atom, a carboxyl group, a cyano group, a nitro group, a phenyl group, a hydroxyl group, a sulfone group, and a thiol group.

5. The circuit board according to claim 4, wherein the halogen atom is a fluorine atom, a chlorine atom, a bromine atom, or an iodine atom.

6. The circuit board according to claim 1, wherein a weight-average molecular weight of the compound represented by Formula 1 is 10,000 to 1,000,000.

7. The circuit board according to claim 1, wherein another of $X^1$, $X^2$, $X^3$, and $X^4$ includes a chlorine atom.

8. The circuit board according to claim 1, wherein the second insulating layer is provided so as to contact the substrate.

9. The circuit board according to claim 1, wherein the organic semiconductor layer has a p-type semiconducting property.

10. The circuit board according to claim 1, wherein the second insulating layer is formed on the substrate, the source electrode and the drain electrode are formed on the second insulating layer, the organic semiconductor layer is formed on the source electrode and the drain electrode, the first insulating layer is formed on the organic semiconductor layer, and the gate electrode is formed on the first insulating layer.

11. The circuit board according to claim 1, wherein the second insulating layer is formed on the substrate, the organic semiconductor layer is formed on the second insulating layer, the source electrode and the drain electrode are formed on the organic semiconductor layer, the first insulating layer is formed on the source electrode and the drain electrode, and the gate electrode is formed on the first insulating layer.

12. An electro-optical device comprising the circuit board according to claim 1.

13. An electronic apparatus comprising the electro-optical device according to claim 12.

14. The circuit board of claim 1, wherein at least one of $X^1$, $X^2$, $X^3$, and $X^4$ is an —OH group.

15. The circuit board of claim 1, wherein at least one of $X^1$, $X^2$, $X^3$, and $X^4$ is an —$NO_2$ group.

16. The circuit board of claim 1, wherein at least one of $X^1$, $X^2$, $X^3$, and $X^4$ is a phenyl group.

17. The circuit board of claim 1, wherein at least one of $X^1$, $X^2$, $X^3$, and $X^4$ is an —SH group.

18. The circuit board of claim 1, wherein $X^2$ or $X^4$ is an electrophilic group selected from the group consisting of an —OH group, an —$NO_2$ group, and a phenyl group.

19. A circuit board, comprising:
a substrate;
a first insulating layer having a surface entirely in direct contact with the substrate;
a source electrode and a drain electrode provided directly on the first insulating layer;
an organic semiconductor layer directly contacting the source electrode, the drain electrode, and the first insulating layer;
a second insulating layer having a surface entirely in direct contact with the organic semiconductor layer; and
a gate electrode directly contacting the second insulating layer,
wherein the second insulating layer insulates the source electrode and the drain electrode from the gate electrode, and
the first and second insulating layers each include a compound represented by Formula 1,

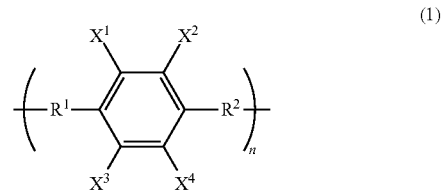

(1)

where $R^1$ and $R^2$ each independently represent a substituted or unsubstituted alkylene group; $X^1$, $X^2$, $X^3$, and $X^4$ each represent hydrogen or an electrophilic group but are not all hydrogen; and n represents a number in the range of 100 to 100,000; and
wherein at least one of $X^1$, $X^2$, $X^3$, and $X^4$ is an electrophilic group selected from the group consisting of an —OH group, an —$NO_2$ group, a phenyl group, and an —SH group.

* * * * *